(12) United States Patent
Nogami et al.

(10) Patent No.: US 6,242,349 B1
(45) Date of Patent: *Jun. 5, 2001

(54) METHOD OF FORMING COPPER/COPPER ALLOY INTERCONNECTION WITH REDUCED ELECTROMIGRATION

(75) Inventors: Takeshi Nogami, Sunnyvale; Sergey Lopatin, Santa Clara; Young-Chang Joo, Sunnyvale, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/207,680

(22) Filed: Dec. 9, 1998

(51) Int. Cl.$^7$ ................................................ H01L 21/44
(52) U.S. Cl. .................................... 438/687; 205/184
(58) Field of Search .......................... 438/687, 628, 438/643, 629, 627, 622, 637, 653, 659, 674, 678; 205/184

(56) References Cited

U.S. PATENT DOCUMENTS

| | | |
|---|---|---|
| 4,789,648 | 12/1988 | Chow et al. . |
| 5,968,333 * | 10/1999 | Nogami et al. ................. 205/184 |
| 5,972,192 * | 10/1999 | Dubin et al. .................... 205/101 |
| 6,043,153 * | 2/2000 | Nogami et al. ................. 438/687 |
| 6,096,648 * | 8/2000 | Lopatin et al. ................. 438/687 |
| 6,103,624 * | 8/2000 | Nogami et al. ................. 438/687 |

* cited by examiner

*Primary Examiner*—Matthew Smith
*Assistant Examiner*—Calvin Lee

(57) ABSTRACT

The electromigration of a Cu or Cu alloy interconnection member is reduced by annealing the seed layer before electroplating or electroless plating the Cu or Cu alloy interconnection member on the seed layer. Embodiments include depositing a Cu or Cu alloy seed layer, annealing at about 100° C. to about 400° C. to increase the grain size of the seed layer and impart a (111)-dominant crystallographic option before plating the Cu or Cu alloy interconnect member thereon the seed layer

16 Claims, 5 Drawing Sheets

METHOD OF FORMING COPPER/COPPER ALLOY INTERCONNECTION WITH REDUCED ELECTROMIGRATION

TECHNICAL FIELD

The present invention relates to copper (Cu) or Cu alloy metallization. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the submicron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use of W is attendant with several disadvantages. For example, most W processes are complex and expensive. Moreover, W has a high resistivity. The Joule heating may enhance electromigration of adjacent Al wiring. Furthermore, the interface of W plugs with the wiring layer is susceptible to void formation, thereby resulting in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al or Al alloys in VLSI interconnect metallizations. Cu exhibits superior electromigration properties and has a lower resistivity than Al or Al alloys. In addition, Cu has improved electrical properties vis-a-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities.

Electroless plating generally involves the controlled auto catalytic deposition of a continuous film on the catalytic surface by the interaction in solution of a metal salt and a chemical reducing agent.

Electroplating comprises the electro deposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are disadvantages attendant upon the use of Cu or Cu alloys. For example, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include W, tantalum (Ta), tantalum nitride (TaN), titanium nitride (TiN), titanium-tungsten (TiW), tungsten nitride (WN), Ti—TiN, titanium silicon nitride (TiSiN), tungsten silicon nitride (WSiN), tantalum silicon nitride (TaSiN) and silicon nitride ($Si_3N_4$) for encapsulating Cu. The use of such barrier materials to encapsulate Cu is not limited to the interface between Cu and the dielectric interlayer, but includes interfaces with other metals as well.

Another problem encountered in conventional Cu or Cu alloy interconnect methodology is an undesirable decrease in electromigration resistance, particularly as design rules extend deeper into the submicron range, e.g., about 0.18 microns and under. Accordingly, the reliability of Cu and Cu alloy interconnect members becomes particularly critical as miniaturization increases.

There exists a need for methodology enabling the formation of Cu and Cu alloy interconnect members having high reliability. There exists a particular need for improving the electromigration resistance of Cu and Cu alloy interconnect members.

DISCLOSURE OF THE INVENTION

An advantage of the present invention is a method of manufacturing a semiconductor device having highly reliable Cu and Cu alloy interconnect members.

Another advantage of the present invention is a method of manufacturing a semiconductor device comprising a Cu or Cu alloy interconnect member having improved electromigration resistance.

Additional advantages and other features of the present invention will be set forth in the description which follows, and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method comprising: depositing a seed layer having an as-deposited first grain size; annealing the seed layer to increase its as-deposited first grain size to a second grain size greater than the first grain size; and electroplating or electroless plating copper (Cu) or a Cu alloy on the annealed seed layer.

Another aspect of the present invention, is a method of manufacturing a semiconductor device, the method comprising: forming a dielectric layer overlying a substrate; forming an opening in the dielectric layer; depositing a Cu or Cu alloy seed layer in the opening; annealing the seed layer to increase its grain size; electroplating or electroless plating a Cu or Cu alloy layer on the annealed seed layer in the opening and over the dielectric layer; and removing any portion of the Cu or Cu alloy layer beyond the opening.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
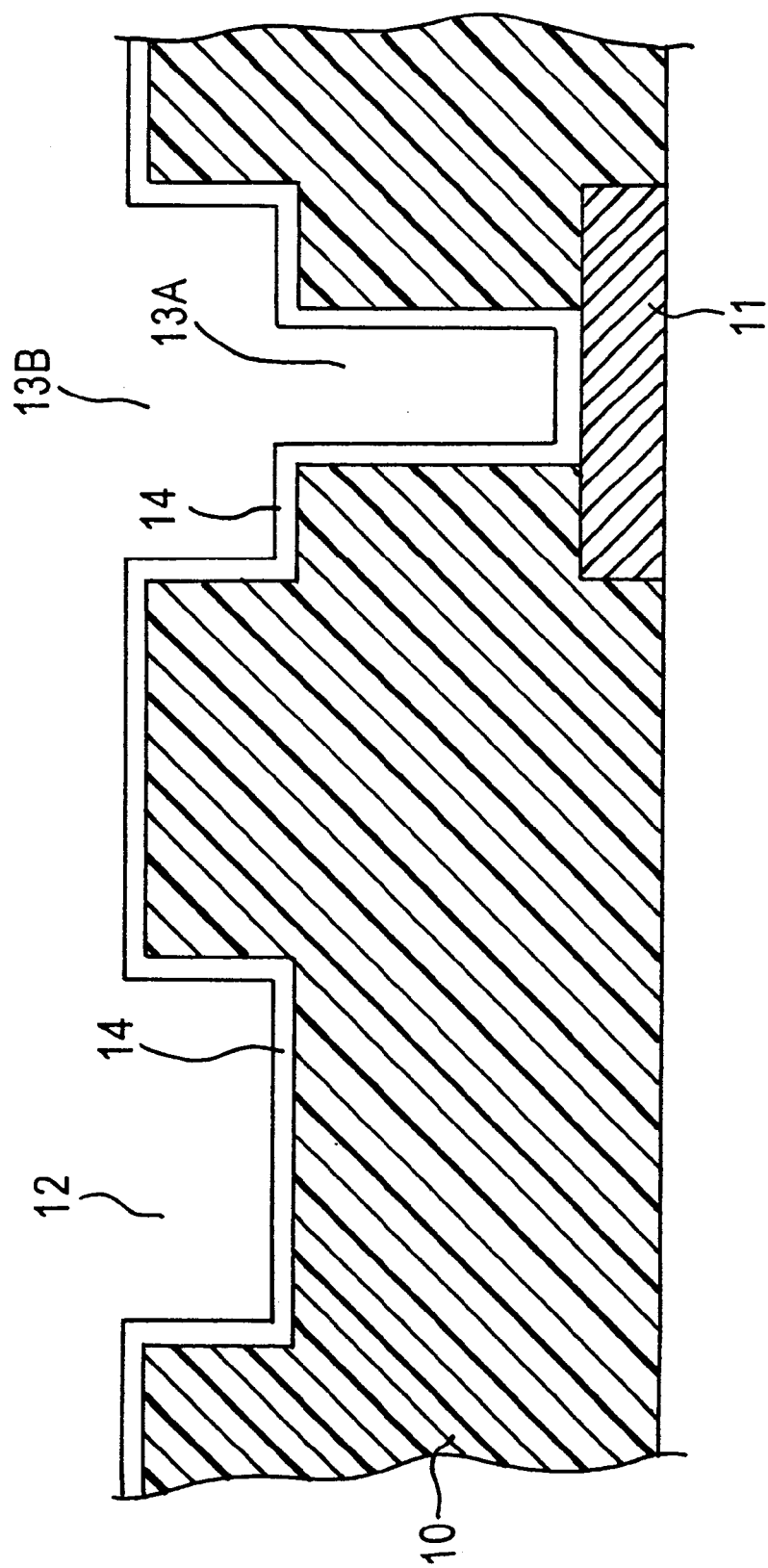
FIGS. 1–3 illustrate sequential phases of a method in accordance with an embodiment of the present invention.

The present invention provides reliable Cu and Cu alloy interconnect members exhibiting improved electromigration resistance. The advantages of the present invention are particularly beneficial in manufacturing semiconductor devices with design features into the deep submicron range, i.e., semiconductor devices having a design rule of about 0.18 microns and under.

The microstructure of Cu and Cu alloy layers formed by plating, such as electroplating or electroless plating, it is strongly affected by the microstructure of the underlying seed layer, such as a Cu or Cu alloy seed layer. Conventional practices comprise depositing an initial Cu or Cu alloy seed layer by sputtering or by CVD. However, such deposited seed layers have a microstructure with a small grain size, e.g., about 0.05 microns to about 0.5 microns, e.g., about 0.1 microns. In addition, such conventionally formed seed layers do not exhibit a (111)-dominant crystallographic orientation. Consequently, Cu or Cu alloy layers plated thereon exhibit a small grain size and do not exhibit a (111)-dominant crystallographic orientation which is desirable for electromigration resistance. It was also found that subsequent to plating Cu or Cu alloy layer on a conventional deposited seed layer, grain growth occurs even without heating. Such grain growth drives copper atoms from the seed layer situated at an underlying barrier metal interface away from the interface to participate in grain growth, thereby causing void formation at the interface between the seed layer and underlying barrier metal layer. The resulting relatively small grain size of the plated Cu or Cu alloy layer, e.g., about 0.05 microns to about 0.5 micron, the lack of a (111)-dominant crystallographic orientation in the plated Cu or Cu alloy layer, and void formation at the seed layer/barrier metal interface each adversely impacts electromigration resistance.

In accordance with embodiments of the present invention, the above-mentioned problems attendant upon conventional Cu or Cu alloy metalization methodology are solved by the strategic interposition of an annealing step subsequent to seed layer deposition and prior to plating. Thus, embodiments of the present invention comprise depositing a seed layer, e.g. a Cu or a Cu alloy seed layer, by sputtering or CVD in accordance with conventional practices. The seed layer is deposited at an appropriate thickness, of about 50 Å to about 3000 Å, e.g. about 1200 Å. The seed layer can comprise elemental Cu or an alloy of Cu with about 0.1 at. % to about 5 at. % of a suitable alloying element, such as tin, magnesium, palladium or zirconium.

Subsequent to depositing of the seed layer, annealing is conducted to increase the grain size as-deposited seed layer.

For example, in depositing a Cu or Cu alloy seed layer, annealing is conducted at a temperature of about 100° C. to about 400° C., e.g. about 150° C., thereby increasing the grain size of the Cu or Cu alloy seed layer from an as-deposited grain size of about 0.05 microns to about 0.5 microns, e.g., about 0.1 micron, to an annealed grain size of about 0.5 microns to about 3 microns, e.g., about 1 micron. In addition, the annealed Cu or Cu alloy seed layer exhibits a (111)-dominant crystallographic orientation thereby, enabling plating of a Cu or Cu alloy interconnect member thereon having a (111)-dominant crystallographic orientation.

Given the present disclosure and disclosed objective, the optimum annealing conditions can easily be determined in a particular situation. For example, when employing a Cu or Cu alloy layer, annealing can be conducted at a temperature of about 100° C. to about 400° C., e.g. about 150° C., for about thirty seconds to about thirty minutes, e.g. about one minute, in a vacuum or in an atmosphere containing argon, nitrogen or hydrogen.

The exact mechanism underpinning the advantageous reduction in electromigration achieved by the present invention is not known with certainty. However, it is believed that annealing the seed layer results in two positive advantages. Firstly, annealing induces grain growth of the seed layer forming a stable grain structure and dominant (111) orientated grains. Consequently, Cu or a Cu alloy plated on the annealed seed layer exhibits a larger grain size with a higher (111) crystallographic texture, thereby improving electromigration resistance. Secondly, annealing the seed layer advantageously increases bonding between the seed layer and underlying barrier metal layer before electroplating. Consequently, copper atoms at the seed layer/barrier metal layer interface do not migrate during electroplating or subsequent to electroplating, thereby reducing void formation at the interface and, hence, improving electromigration resistance.

Cu or Cu alloy interconnect members formed in accordance with the present invention can be, but are not limited to, interconnects formed employing damascene technology. Thus, embodiments of the present invention include forming a dielectric interlayer overlying a substrate, forming an opening, e.g., a damascene opening, in the dielectric layer, depositing a diffusion barrier layer, such as TaN, and filling the opening with Cu or a Cu alloy layer. Advantageously, the opening in the dielectric interlayer can be filled by initially depositing a seed layer, annealing, and then electroplating or electroless plating the Cu or Cu alloy layer. CMP is then performed such that the upper surface of the Cu or Cu alloy layer is substantially coplanar with the upper surface of the dielectric interlayer.

Thus, in accordance with the present invention a highly reliable Cu or Cu alloy interconnect member is formed in a damascene opening with superior electromigration resistance. The damascene can be a trench, in which case the Cu or Cu alloy metalization forms an interconnection line, or a via/contact hole at which case the metalization forms a via/contact. Double damascene techniques can also be employed to form an opening containing a first portion forming a trench and a second portion forming a via/contact hole in communication with the trench, in which case the metalization comprises a first section filling the trench and forming an interconnection line and a second portion filling the hole and forming a contact/via in electrical connection with the interconnection line.

Embodiments of the present invention include depositing a diffusion barrier layer prior to depositing the seed layer. Such a diffusion barrier layer can comprise any of a variety of metals, such as tantalum(Ta), Ta alloys, W or W alloys, or titanium(Ti). The diffusion barrier layer can be formed at a thickness of about 50 Å to about 1500 Å.

Embodiments of the present invention include electroless plating or electroplating various Cu alloys, such as alloys of Cu with magnesium, zinc, zirconium, tin, nickel or platinum. After electroplating or electroless plating, planarization is typically performed, as by CMP.

In the various embodiments of the present invention, conventional substrates and dielectric interlayers, barrier layers and capping layers can be employed. For example, the substrate can be doped monocrystalline silicon or gallium-arsenide. The dielectric interlayer employed in the present invention can comprise any dielectric material conventionally employed in the manufacture of semiconductor devices. For example, dielectric materials such as silicon dioxide, phosphosilicate-glass (PSG), boron doped PSG (BPSG), and silicon dioxide derived from tetraethylorthosilicate (TEOS) or silane by PECVD can be employed. Dielectric interlayers in accordance with the present invention can also comprise low dielectric constant materials, including polymrers, such as polyimides. The openings formed in dielectric layers can be formed by conventional photolithographic and etching techniques.

Embodiments of the present invention also include forming a capping layer, on the Cu or Cu alloy interconnect after CMP. The conditions under which a capping layer, such as silicon nitride, are deposited are conventional and, hence, not elaborated upon herein.

Figure 2:
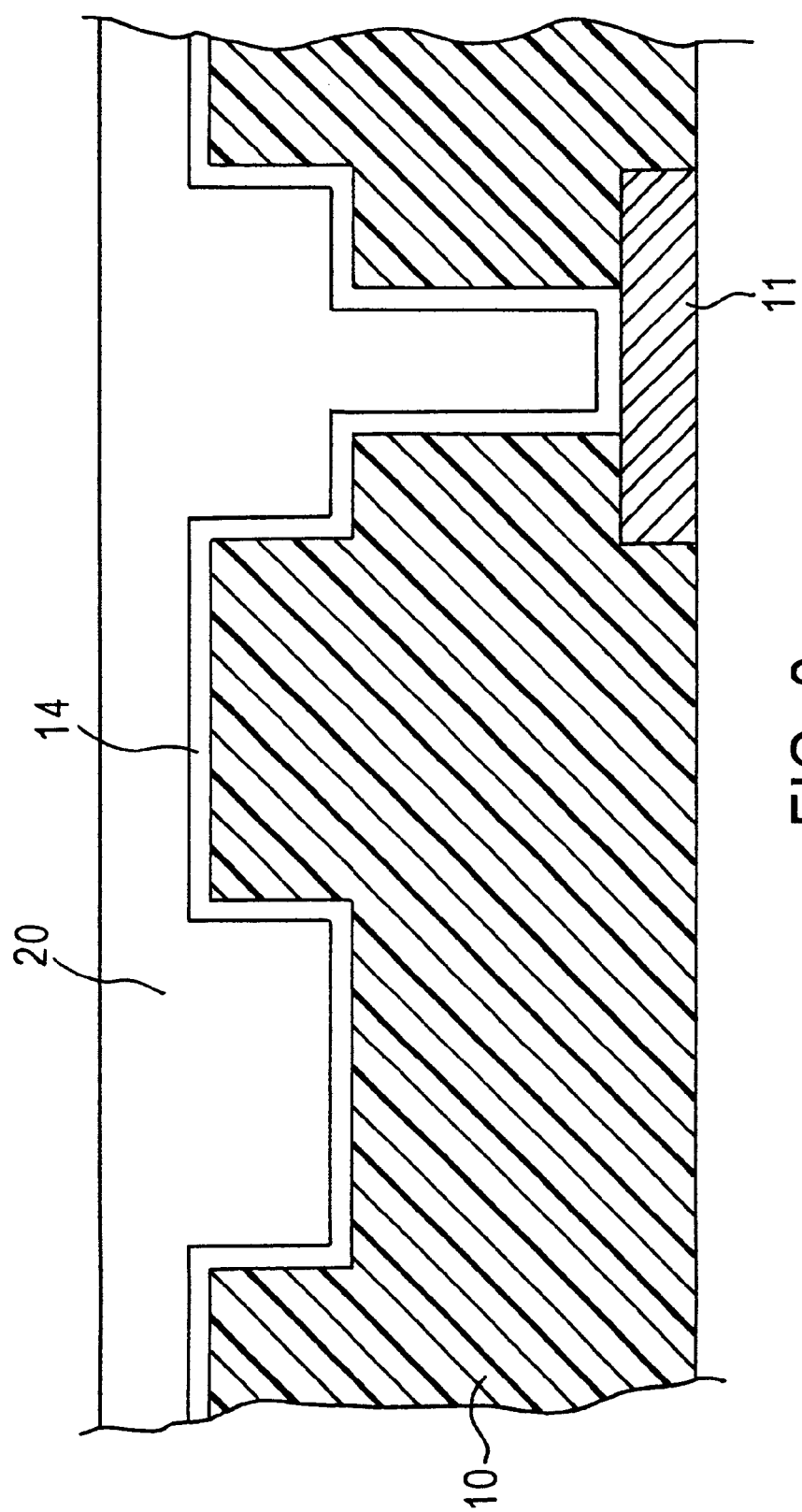
Figure 3:
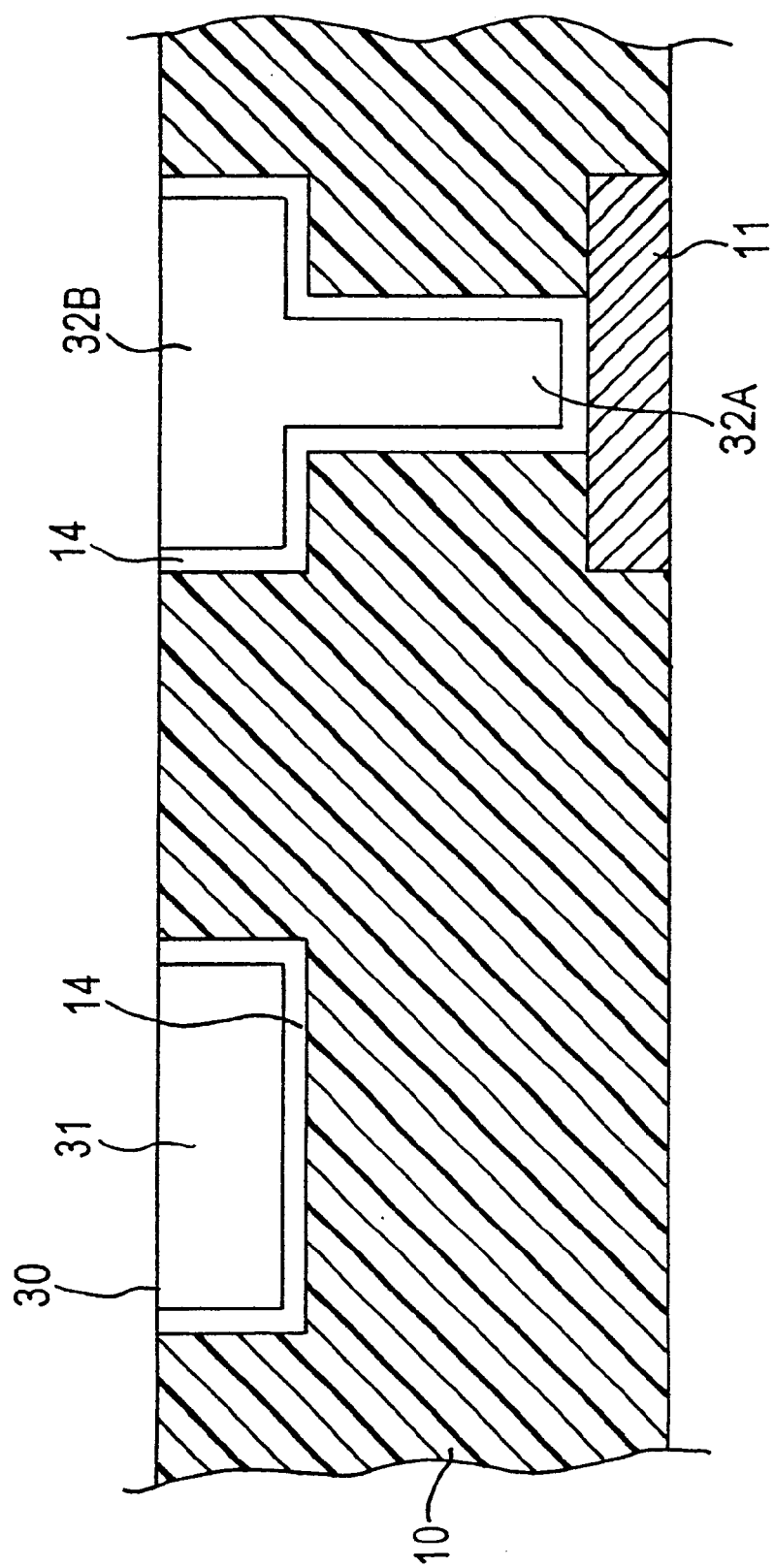

An embodiment of the present invention is schematically illustrated in FIGS. 1–3, wherein similar reference numerals denote similar features. Adverting to FIG. 1, damascene openings are etched in a conventional manner in dielectric layer 10. typically comprising silicon dioxide. The damascene openings include a trench 12 and a dual damascene opening comprising via hole 13A in communication with trench 13B. As illustrated, via hole 13A communicates with an underlying interconnection line 11. However, the present invention is also applicable to a single damascene opening comprising a via hole, a single damascene comprising a contact hole or a dual damascene opening comprising a contact hole in communication with the trench.

With continued reference to FIG. 1, after forming the damascene opening or openings, a seed layer 14, e.g. Cu or Cu alloy, is deposited to line the damascene openings. The seed layer can be deposited by a physical vapor deposition technique, such as sputtering, or by a CVD technique.

After depositing seed layer 14, annealing is conducted to increase the grain size and (111) crystallographic orientation of the as-deposited seed layer. Adverting to FIG. 2, a Cu or Cu alloy layer 20 is deposited as by electroplating or electroless plating, on the surface of the annealed seed layer 14. Subsequently, as shown in FIG. 3, CMP is performed to provide a planarized upper surface 30. Cu or Cu alloy metal interconnection line 31 is formed in trench 12 (FIG. 1), while a dual damascene Cu or Cu alloy metalization structure comprising via 32A connected to interconnection line 32B is formed in via hole 13A and trench 13B (FIG. 1)

Figure 4:
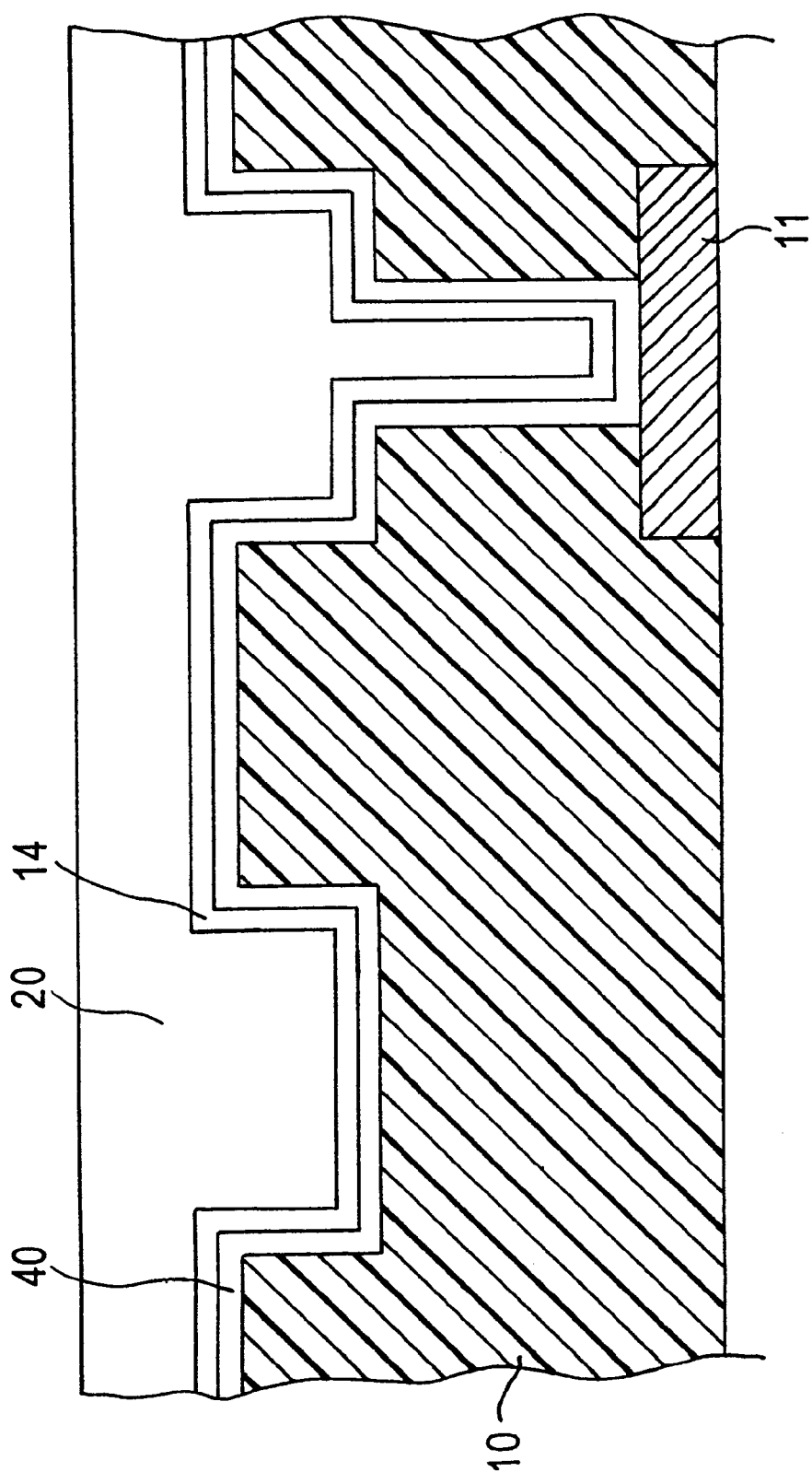
FIGS. 4 and 5 illustrate sequential phases of a method in accordance with an embodiment of the present invention.
Figure 5:
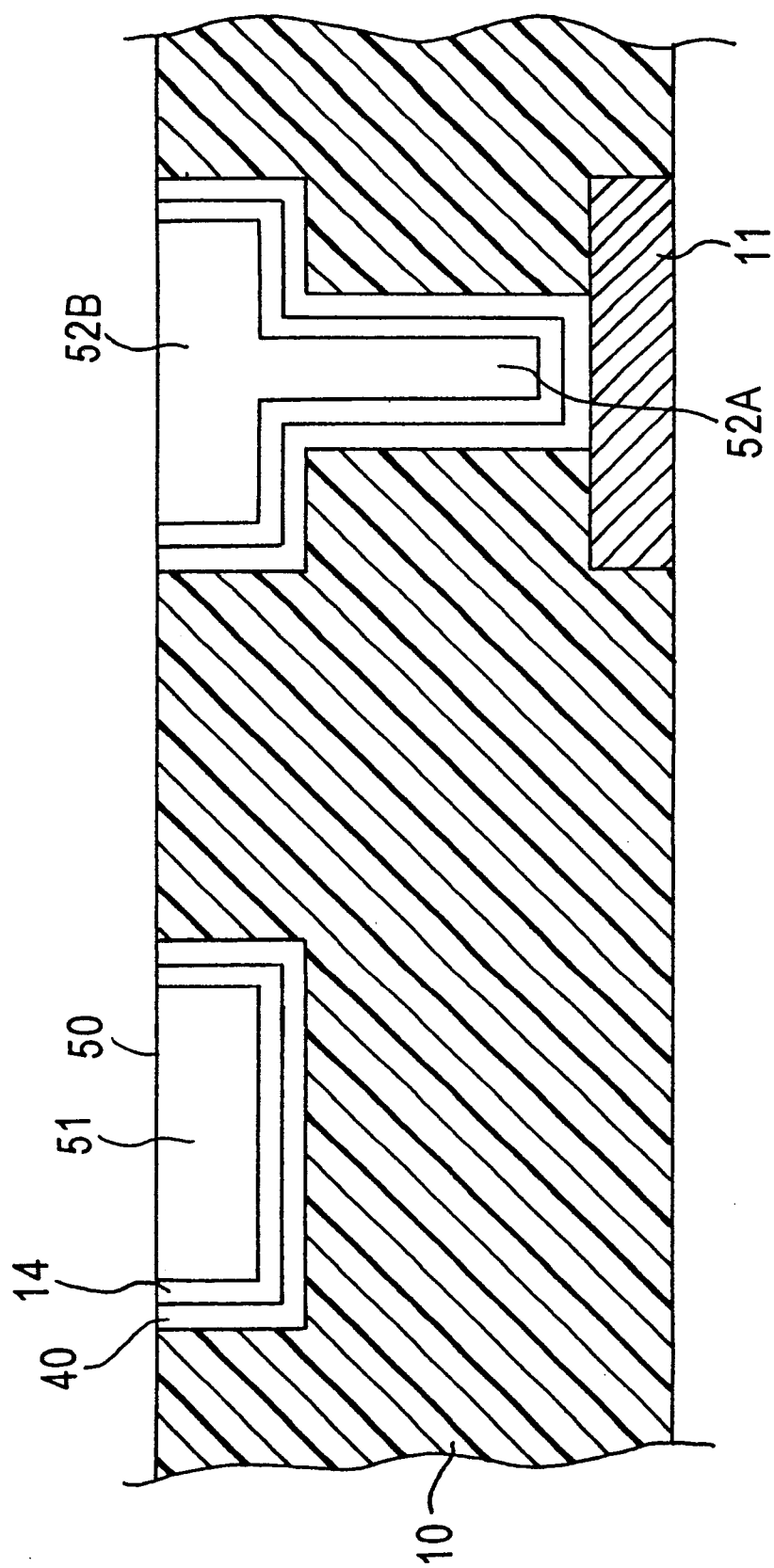

Another embodiment of the present invention is schematically illustrated in FIGS. 4 and 5, wherein features similar to those illustrated in FIGS. 1–3 bear similar reference numerals. Adverting to FIG. 4, this embodiment differs from the embodiment illustrated in FIGS. 1–3 in that after forming the damascene openings, an initial barrier layer 40 is deposited in the damascene openings. Barrier layer 40 provides additional protection against diffusion of copper atoms from the metalization through dielectric layer 10. Suitable barrier layer materials can include Ti, W, tin, silicon, nitrogen, palladium, tantalum and alloys thereof. After depositing barrier layer 40, a Cu or Cu alloy layer 20 is deposited, as by electroless plating or electroplating, filling the damascene openings and extending above the upper surface of substrate 10. Averting to FIG. 5, CMP is then conducted to form a planarized upper surface 50. The resulting Cu or Cu alloy metalization comprises interconnection line 51 and a dual damascene metalization structure comprising via 52A electrically connected to interconnection lines 52B. In the embodiment illustrated in FIGS. 4 and 5, annealing provides the additional advantage of improving bonding between the Cu or Cu alloy seed layer 14 and barrier layer 40, such that copper atoms at the seed layer/barrier layer interface do not migrate during or subsequent to plating, thereby avoiding the formation of voids at the interface and, hence, improving electromigration resistance.

Another embodiment of the present invention, although not illustrated, includes initially depositing an adhesion promoting layer prior to depositing the diffusion layer (40, FIG. 4). Such adhesion promoting layer can comprise materials such as chromium, tantalum, vanadium and molybdenum. Also, although not illustrated, the present invention encompasses the conventional practice of depositing a capping layer, such as silicon nitride, on the exposed surface of the Cu or Cu alloy interconnect member.

The present invention enables the formation of extremely reliable Cu or Cu alloy interconnect members with significantly improved electromigration resistance. The present invention is applicable to the formation of various types of inlaid Cu and Cu alloy metalization interconnection patterns. The present invention is particularly applicable in manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practices without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications with the scope of the inventive concept as expressed herein.

What is claimed is:

1. A method comprising:
   depositing a seed layer having an as-deposited first grain size;
   annealing the seed layer to increase its grain size to a second grain size greater than the first grain size; and
   electroplating or electroless plating copper (Cu) or a Cu alloy on the annealed seed layer.

2. The method according to claim 1, comprising manufacturing a semiconductor device.

3. The method according to claim 2, comprising annealing such that the seed layer exhibits a (111)-dominant crystallographic orientation.

4. The method according to claim 2, comprising:
   depositing a Cu or Cu alloy seed layer by sputtering or chemical vapor deposition at a thickness of about 50 Å to about 3000 Å; and
   annealing at a temperature of about 100° C. to about 400° C.

5. The method according to claim 4 comprising annealing for about 30 seconds to about 30 minutes in a vacuum or in an atmosphere comprising argon, nitrogen or hydrogen.

6. The method according to claim 4, wherein the seed layer comprises an alloy of Cu and about 0.1 to about 5 at. % of tin, magnesium, palladium or zirconium.

7. The method according to claim 2, wherein:
   the first grain size is about 0.05 µm to about 0.5 µm; and
   the second grain size is about 0.5 µm to about 3 µm.

8. The method according to claim 2, further comprising:
   forming a dielectric layer overlying a substrate;
   forming an opening in the dielectric layer,
   depositing a Cu or Cu alloy seed layer in the opening;
   annealing the seed layer;
   electroplating or electroless plating a Cu or Cu alloy layer on the seed layer in the opening and over the dielectric layer; and
   removing any portion of the Cu or Cu alloy layer beyond the opening.

9. The method according to claim 8, comprising:
   depositing a barrier layer in the opening; and
   depositing the seed layer on the barrier layer.

10. The method according to claim 8, wherein:
    the opening is a trench; and
    the plated Cu or Cu alloy layer forms an interconnecting line.

11. The method according to claim 10, wherein:
    the opening further comprises a via or contact hole in communication with the trench; and
    the plated Cu or Cu alloy layer comprises a first portion filling the trench forming an interconnection line and a second portion filling the hole forming a via or contact in electrical communication with the interconnection line.

12. The method according to claim 8, wherein:
    the opening comprises a via or contact hole; and
    the plated Cu or Cu alloy layer forms a via or contact.

13. The method according to claim 2, wherein the plated Cu or Cu alloy exhibits a grain size of about 0.5 µm to about 3 µm.

14. The product produced by the method according to claim 2.

15. The method according to claim 1, comprising depositing a Cu or Cu alloy seed layer.

16. The method according to claim 1, comprising electroless plating the Cu or Cu alloy on the annealed seed layer.

* * * * *